(12) United States Patent
Cai (10) Patent No.: US 12,402,486 B2
(45) Date of Patent: Aug. 26, 2025

(54) DISPLAY PANEL INCLUDING BLACK MATRIX OPENING AND LIGHT EXTRACTION OPENING, AND DISPLAY DEVICE

(71) Applicant: Hubei Yangtze Industrial Innovation Center Of Advanced Display Co., Ltd., Wuhan (CN)

(72) Inventor: Yu Cai, Wuhan (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 505 days.

(21) Appl. No.: 17/955,572

(22) Filed: Sep. 29, 2022

(65) Prior Publication Data

US 2023/0397457 A1 Dec. 7, 2023

(30) Foreign Application Priority Data

Jun. 2, 2022 (CN) .......................... 202210621191.8

(51) Int. Cl.
*H10K 59/122* (2023.01)
*H10K 50/85* (2023.01)
*H10K 50/86* (2023.01)

(52) U.S. Cl.
CPC ........... *H10K 59/122* (2023.02); *H10K 50/85* (2023.02); *H10K 50/865* (2023.02)

(58) Field of Classification Search
CPC ..... H10K 59/122; H10K 50/85; H10K 50/865
USPC ........................................................ 257/618
See application file for complete search history.

(56) References Cited

U.S. PATENT DOCUMENTS

| 2022/0020968 A1 | 1/2022 | Zhang |
| 2022/0140007 A1 | 5/2022 | Yan et al. |
| 2022/0206620 A1* | 6/2022 | Lee .......................... H10K 59/40 |

FOREIGN PATENT DOCUMENTS

| CN | 11091 1441 A | 3/2020 |
| CN | 111799393 A | 10/2020 |
| CN | 112103328 A | 12/2020 |
| CN | 112670431 A | 4/2021 |
| CN | 112736210 A | 4/2021 |
| CN | 113380969 A | 9/2021 |
| CN | 113394351 A | 9/2021 |
| CN | 114068843 A | 2/2022 |
| CN | 114335389 A | 4/2022 |

OTHER PUBLICATIONS

The First Office Action dated Apr. 9, 2025 for Chinese Application No. 202210621191.8, 15 pages.

* cited by examiner

*Primary Examiner* — Quoc D Hoang
(74) *Attorney, Agent, or Firm* — East IP P.C.

(57) ABSTRACT

The application provides a display panel and a display device. The display panel includes: a black matrix opening and a light extraction opening, wherein an orthographic projection of the black matrix opening on a substrate is a second projection, and a geometric center of the second projection is a second center, and wherein an orthographic projection of the light extraction opening on the substrate is a third projection, and a geometric center of the third projection is a third center; the second center and the third center are not aligned with each other.

20 Claims, 7 Drawing Sheets

DISPLAY PANEL INCLUDING BLACK MATRIX OPENING AND LIGHT EXTRACTION OPENING, AND DISPLAY DEVICE

CROSS-REFERENCE TO RELATED APPLICATION

The present application claims priority to Chinese Patent Application No. 202210621191.8, filed on Jun. 2, 2022, which is incorporated herein by reference in its entirety.

TECHNICAL FIELD

The present application relates to the field of display technologies, and particularly to a display panel and a display device.

BACKGROUND

Compared to a liquid crystal display screen, an organic light-emitting display screen has many advantages such as being thinner and lighter, having higher brightness, lower power consumption, faster response, higher definition, better flexibility, higher light-emitting efficiency or the like, and has gradually become a mainstream display technology. A light-emitting principle of the organic light-emitting display screen is that holes generated by an anode and electrons generated by a cathode in an organic light-emitting device move under an electric field so as to be injected into a hole transport layer and an electron transport layer respectively, and then transferred to an organic light-emitting material layer, and when they meet in the light-emitting material layer, energy excitons are generated to excite light-emitting molecules in the organic light-emitting material layer to generate visible light.

An organic light-emitting display screen includes multiple layers of film structures with different refractive indices, so light emitted by a pixel will be reflected and refracted in various ways but not be emitted directly above the pixel, which affects brightness of emitted light. Moreover, light from the pixel with a broad range of angles may reach an adjacent pixel, which causes problems of color mixture.

SUMMARY

In view of this, the present application provides a display panel and a display device which is able to solve the problem of deterioration in brightness at some viewing angles caused by a light extraction unit in the related art, improve color deviation at some viewing angles of the display panel and effectively improve light-emitting efficiency and display effect of the display panel.

In a first aspect, the present application provides a display panel, including a substrate; a pixel definition layer located on a side of the substrate and including multiple pixel openings, which define light-emitting units; a light filtering layer and a light extraction layer located on a side of a light-emitting layer including the light-emitting units away from the substrate; the light filtering layer includes black matrixes that include black matrix openings, which are disposed corresponding to the light-emitting units; and the light extraction layer includes a first matching layer and a second matching layer, the first matching layer is located on a side of the second matching layer close to the substrate, and includes light extraction openings, which are disposed corresponding to the light-emitting units; wherein an orthographic projection of the pixel opening on the substrate is a first projection, a geometric center of the first projection is a first center, an orthographic projection of the black matrix opening on the substrate is a second projection, a geometric center of the second projection is a second center, an orthographic projection of the light extraction opening on the substrate is a third projection, and a geometric center of the third projection is a third center; and wherein the second center and the third center are not aligned with each other.

In a second aspect, the present application further provides a display device including the display panel according to the present application.

DETAILED DESCRIPTION

In order to make the above objects, features and advantages of the present application clearer and more comprehensible, the present application is further described below with reference to the accompanying drawings and embodiments.

It should be noted that specific details are described in the following description in order to understand the present application thoroughly. However, the present application can be implemented in many other ways different from those described herein, and those skilled in the art can make similar improvements without departing from concepts of the present application. Accordingly, the present application is not limited by specific implementations described below. In addition, in the following description, the same reference numerals in the drawings show the same or similar structures, and thus their repeated descriptions will be omitted.

Figure 1:
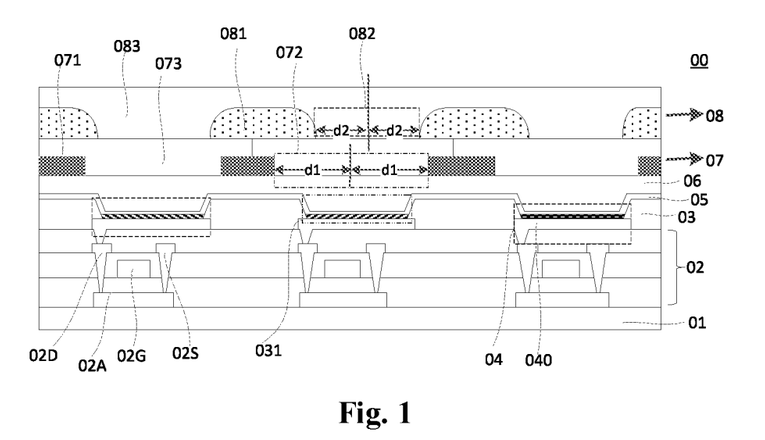
FIG. 1 is a schematic view of an optional implementation of a display panel according to an embodiment of the present application.
Figure 2:
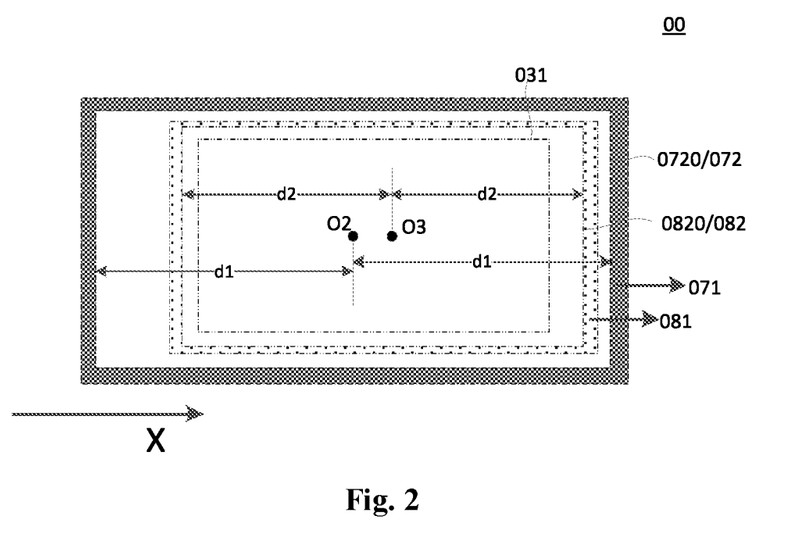
FIG. 2 is an optional schematic top view of the display panel shown in FIG. 1.

FIG. 1 is a schematic view of an optional implementation of a display panel according to an embodiment of the present application. FIG. 2 is an optional schematic top view of the display panel shown in FIG. 1. As shown in FIG. 1, the display panel 00 includes a substrate 01, a pixel definition layer 03 and light-emitting units 04, the pixel definition layer 03 is located on a side of the substrate 01 and includes multiple pixel openings 031 which define the light-emitting units 04. It should be noted that the pixel openings 031 defining the light-emitting units 04 means there exist the light-emitting units 04 at positions of the pixel openings 031, and generally, the pixel opening 031 may have the same size as the light-emitting unit. Still referring to FIG. 1, the display pane 100 further includes a light filtering layer 07 located on a side of a light-emitting layer including the light-emitting units away from the substrate 01, the light filtering layer 07 includes black matrixes 071 including black matrix openings 072, which are disposed corresponding to the light-emitting units 04. It should be noted that the black matrix openings 072 and the light-emitting unit 04 are disposed correspondingly, and it may be that a light-emitting unit 04 corresponds to a black matrix opening 072 or a black matrix opening 072 corresponds to multiple light-emitting units 04, and light emitted by the multiple light-emitting units 04 corresponding to a same black matrix opening 072 may be of the same color or of different colors. Optionally, the black matrix 071 includes a light absorbing material and may be a black light absorbing material or a structure formed by color resist materials of different colors that are alternately stacked. Still referring to FIG. 1, the display panel 00 includes a light extraction layer 08 located on a side of the light-emitting units 04 away from the substrate 01, the light extraction layer 08 includes a first matching layer 081 and a second matching layer 083, the first matching layer 081 is located on a side of the second matching layer 083 close to the substrate 01, and a refractive index of the first matching layer 081 is smaller than a refractive index of the second matching layer 083. The first matching layer 081 includes light extraction openings 082 that are disposed corresponding to the light-emitting units 04. It should be noted that the light extraction openings 082 and the light-emitting units 04 are disposed correspondingly, and it may be that a light-emitting unit 04 correspond to a light extraction opening 082 or a light extraction opening 082 corresponds to multiple light-emitting units 04, and light emitted by the multiple light-emitting units 04 corresponding to a same light extraction opening 082 may be of the same color or of different colors.

Optionally, the display panel may further includes an array layer 02 located between the pixel definition layer 03 and the substrate 01, the array layer 02 includes multiple thin film transistors, each of which includes a source electrode 02S and a drain electrode 02D, a gate electrode 02G and an active layer 02A. This application only illustrates the technical solution in which there is one thin film transistor. It should be understood that there may be any number of thin film transistors, the specific number may be set according to specific requirements of the display panel, which is not specifically limited in this embodiment.

Referring both FIG. 1 and FIG. 2, an orthographic projection of the pixel opening 031 on the substrate 01 is a first projection 0310, a geometric center of the first projection 0310 is a first center O1; an orthographic projection of the black matrix opening 072 on the substrate 01 is a second projection 0720, a geometric center of the second projection 0720 is a second center O2; an orthographic projection of the light extraction opening 082 on the substrate 01 is a third projection 0820, and a geometric center of the third projection 0820 is a third center O3, wherein the second center O2 and the third center O3 are not aligned with each other. Compared to the related art, provision of the light extraction layer 08 can improve light-emitting efficiency of the display panel 00. In the light extraction layer 08 and the light filtering layer 07, the third center O3 of the light extraction opening 082 and the second center O2 of the black matrix opening 072 are not aligned with each other, that is, the light extraction opening 082 and the black matrix opening 072 have different deviated positions, which can not only ensure light-emitting efficiency of the display panel through the light extraction layer, but also enable adjustment of brightness at a viewing angle by using positions of color resist units of the light filtering layer and deviation positions of the black matrix openings due to non-complete overlapping of the black matrix opening and the light extraction opening, so as to improve azimuthal chromatic aberration caused by light extraction structures. In addition, since the light extraction opening and the black matrix opening are deviated in opposite positions, an influence of fluctuation in an involved process on light-emitting efficiency can be reduced, which migrates an optical difference of viewing angles in different directions of the display panel, promotes a light-emitting effect of the display panel and guarantees a display effect of the display panel.

Still referring to FIG. 1 and FIG. 2, along a direction from a light-emitting unit to another light-emitting unit, a distance from the second center O2 to each of two edges of the second projection 0720 is d1, and a distance from the third center O3 to each of two edges of the third projection 0820 is d2, that is to say, along the direction from the first light-emitting unit to the another light-emitting unit, the distance from the second center O2 to one edge of the second projection 0720 is equal to the distance from the second center O2 to the other edge of the second projection 0720, and the distance from the third center O3 to one edge of the third projection 0820 is equal to the distance from the third center O3 to the other edge of the third projection 0820.

As shown in FIG. 1, the light-emitting layer 04 includes an anode 040, a light-emitting material layer 04A and a cathode 05, wherein the anode 040 includes a material of ITO/Ag/ITO, and the cathode 05 includes a material of a magnesium-silver alloy. In the embodiment of the present application, the light-emitting unit 04a may be prepared by an organic light emitting diode (OLED). Alternatively, the light-emitting unit 04 may be a micro light emitting diode (Micro-LED) or a quantum dot light emitting diode (QLED).

Optionally, the display panel 00 further includes a thin film encapsulation layer 06 located between a light modulation structure and the light-emitting units 04. Optionally, the thin film encapsulation layer 06 may include one film layer, two film layers, or three or more layers, and the thin film encapsulation layer 06 may include alternately stacked organic layers and inorganic layers. In the display panel according to this embodiment, the substrate 01 is a flexible substrate, which is bendable, and optionally, the thin film encapsulation layer 06 may have better bendability. The display panel in this embodiment is thus bendable. This embodiment does not specifically limit specific materials and film structures of the thin film encapsulation layer 06.

Optionally, the light filtering layer is located on a side of the light extraction layer close to the substrate, and along a first direction, a width of the black matrix opening is wider than a width of the light extraction layer opening, wherein the first direction is a direction from a light-emitting unit to another light-emitting unit.

Still referring to FIG. 1 and FIG. 2, the light filtering layer 07 is located on a side of the light extraction layer 08 close to the substrate 01, and along a first direction X, a width of the black matrix opening 072 is 2d1, and a width of the light extraction opening 082 is 2d2, wherein d1>d2, wherein the first direction X is a direction from a light-emitting unit to another light-emitting unit. That is to say, along the first direction, the width of the black matrix opening is wider than the width of the light extraction layer opening. Compared to the previous embodiment, the light filtering layer 07 is closer to the light-emitting units 04 than the light extraction layer 08 in this embodiment, which can increase an angle for emitting light and reduce a reflectivity of the display panel. Further, since the width of the black matrix opening 072 is wider than the width of the light extraction opening 082, light extraction efficiency of the light extraction layer can be ensured. Furthermore, the wider black matrix opening 072 can prevent normally emitted light from being absorbed by the black matrix, so as to further ensure the light-emitting efficiency.

Optionally, the light filtering layer is located on a side of the light extraction layer away from the substrate, and along a first direction, a width of the black matrix opening is wider than a width of the light extraction layer opening; the first direction is the direction from a light-emitting unit to another light-emitting unit.

Figure 3:
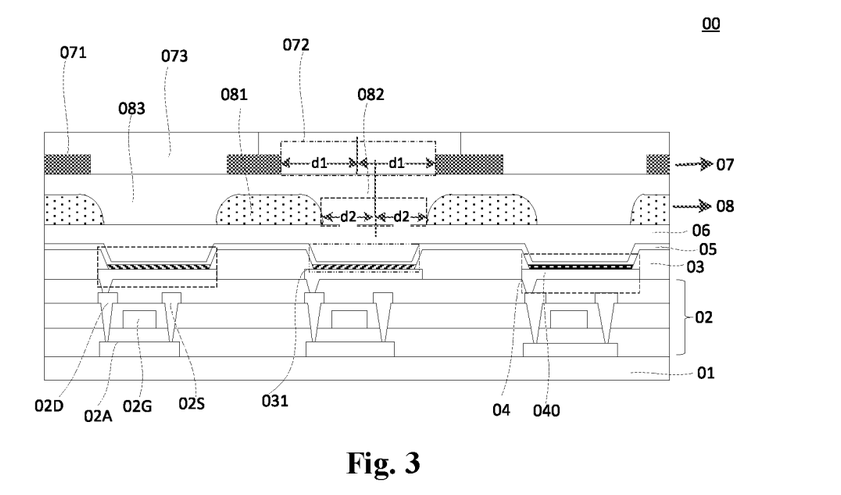
FIG. 3 is a schematic view of another optional implementation of a display panel according to an embodiment of the present application.

FIG. 3 is a schematic view of another optional implementation of a display panel according to an embodiment of the present application. As shown in FIG. 3, the light extraction layer 08 is located between the light filtering layer 07 and the substrate 01, which can reduce the distance from the light extraction layer 08 to the light-emitting units 04 and deflect light emitted at a lager angle through the light extraction layer, to convert it to light having a smaller angle, and thus the light-emitting efficiency can be improved.

It should be noted that various embodiments of the present invention may be combined with each other, and the following embodiments will be mainly described with respect to a situation where the light extraction layer is located on a side of the light filtering layer away from the light-emitting units, but these features are also suitable for the display panel where the light extraction layer is located on a side of the light filtering layer close to the light-emitting units, which also belongs to the protection scope of the present application and is not repeated herein.

Optionally, the second projection covers the third projection, and an area of the second projection is larger than an area of the third projection; and along the first direction, the first center is located between the second center and the third center.

Figure 4:
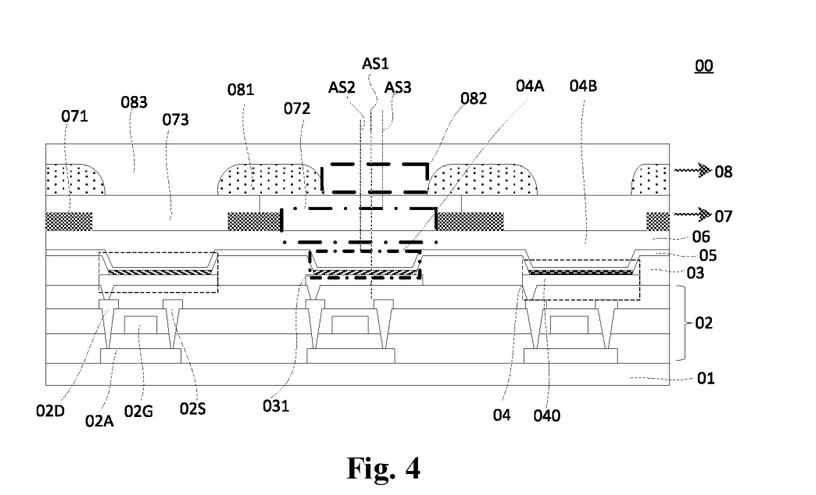
FIG. 4 is a schematic view of another optional implementation of a display panel according to an embodiment of the present application.
Figure 5:
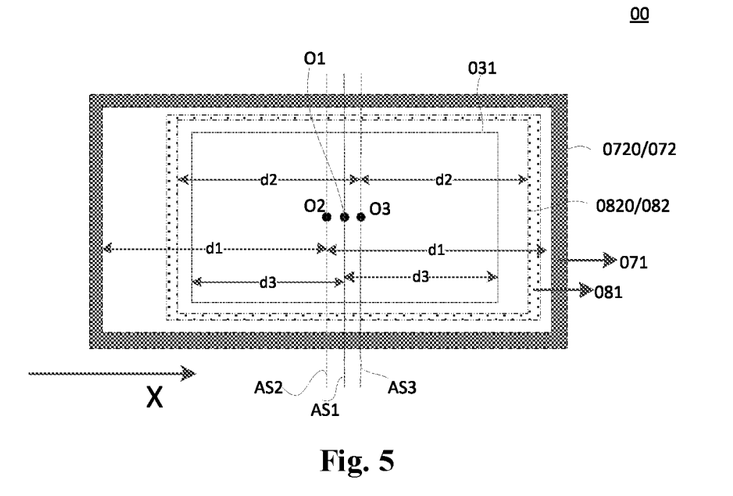
FIG. 5 is another optional schematic top view of a display panel according to an embodiment of the present application.

FIG. 4 is a schematic view of another optional implementation of a display panel according to an embodiment of the present application. FIG. 5 is another optional schematic top view of a display panel according to an embodiment of the present application. As shown in FIG. 4 and FIG. 5, the second projection 0720 covers the third projection 0820, an area of the second projection 0720 is larger than an area of the third projection 0820, and along the first direction X, the first center O1 is located between the second center O2 and the third center O3. In other words, the first center O1 being located between the second center O2 and the third center O3, means that a center of the pixel opening 031 is located between a center of the black matrix opening 072 and a center of the light extraction opening 082, wherein the black matrix opening 072 is deviated relative to the pixel opening 031 in a different direction than that direction in which the light extraction opening 082 is deviated relative to the pixel opening 031. The distance from the first center O1 to each of two edges of the first projection 0310 is d3, that is to say, along the direction from a light-emitting unit to another light-emitting unit, the distance from the first center O1 to one edge of the first projection 0310 is equal to the distance from the first center O1 to the other edge of the second projection 0310.

Optionally, as shown in FIG. 4 and FIG. 5, there is a deviation distance of the light extraction opening 082 relative to the pixel opening 031 along the first direction X, and there is a deviation distance of the black matrix opening 0720 relative to the pixel opening 031 along a direction opposite to the first direction. Compared to the previous embodiment, since the light extraction opening 082 and the black matrix opening 072 are deviated in different directions, a risk of deviation of the light extraction opening and the black matrix opening in a same direction can be avoided, which prevent a decrease in yield rate and display quality of the display panel caused by excessive color deviation at a viewing angle in a certain direction.

Optionally, the distance of the light extraction opening 082 deviated relative to the pixel openings 031 along the first direction X is equal to the distance of the black matrix opening 0720 deviated relative to the pixel opening 031 along the direction opposite to the first direction.

Optionally, the first projection has a first axis of symmetry passing through the first center, the second projection has a second axis of symmetry passing through the second center, and the third projection has a third axis of symmetry passing through the third center; and along the first direction, the first axis of symmetry is located between the second axis of symmetry and the third axis of symmetry.

Still referring to FIG. 4 and FIG. 5, the first projection 0310 has a first axis of symmetry AS1 passing through the first center O1, the second projection 0720 has a second axis of symmetry AS2 passing through the second center O2, and the third projection 0820 has a third axis of symmetry AS3 passing through the third center O3; and along the first direction X, the first axis of symmetry AS1 is located between the second axis of symmetry AS2 and the third axis of symmetry AS3. In other words, the first axis of symmetry AS1 being located between the second axis of symmetry AS2 and the third axis of symmetry AS3 means that the center of the pixel opening 031 is located between the center of the black matrix opening 072 and the center of the light extraction opening 082, and the black matrix opening 072 is deviated relative to the pixel opening 031 in a different direction than that direction in which the light extraction opening 082 is deviated relative to the pixel opening 031. Compared to the previous embodiment, since the light extraction opening 082 and the black matrix opening 072 are deviated in different directions, a risk of deviation of the light extraction opening and the black matrix opening in a same direction can be avoided, which prevent a decrease in yield rate and display quality of the display panel caused by excessive color deviation at a viewing angle in a certain direction.

Figure 6:
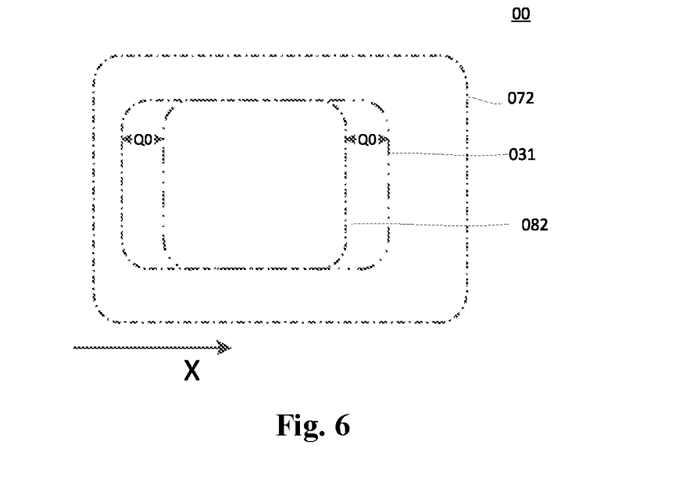
FIG. 6 is another optional schematic top view of a display panel according to an embodiment of the present application.

FIG. 6 is another optional schematic top view of a display panel according to an embodiment of the present application. In order to describe this embodiment more clearly, other features are omitted and not showed in FIG. 6. Along a direction perpendicular to the display panel, FIG. 6 shows that the pixel opening 031, the light extraction opening 082 and the black matrix opening 072 are all rounded rectangles The pixel opening, the light extraction opening 082 and the black matrix opening 072 may be any other shape, such as a circle, an ellipse, etc., which are not limited in the present application. An area of the light extraction opening 082 is equal to an area of the pixel opening 031, and a distance of the light extraction opening 082 deviated relative to the pixel openings 031 in a direction opposite to the first direction X is Q0, that is to say, in the first direction X, the distance from the light extraction opening 082 to the pixel openings 031 is Q0. Optionally, Q0 is smaller than or equal to 1 µm; for example, Q0=0.5 µm. Compared to the previous embodiment, while ensuring light extraction capability of the light extraction layer, light extraction opening 082 and the pixel opening 031 can be prepared with a same exposure and development process since light extraction opening 082 has a same size or approximately same as the pixel opening 031, and thereby cost can be saved.

Figure 7:
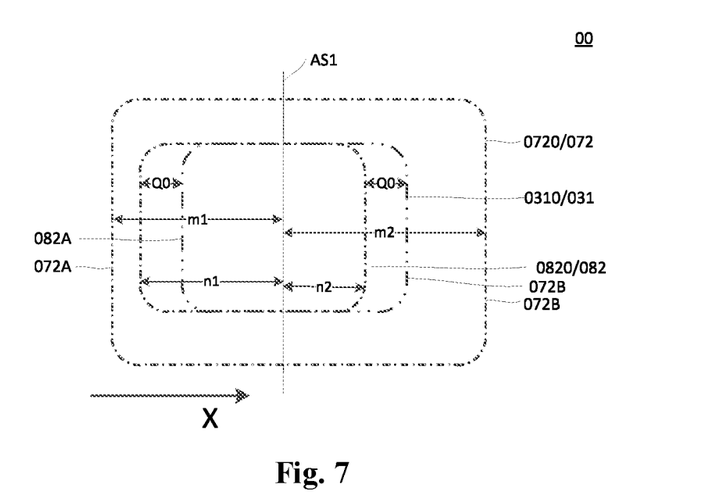
FIG. 7 is another optional schematic top view of a display panel according to an embodiment of the present application.

FIG. 7 is another optional schematic top view of a display panel according to an embodiment of the present application. Optionally, as shown in FIG. 7, along the first direction X, the second projection 0720 corresponding to the black matrix opening 072 includes a first black matrix edge 072A and a second black matrix edge 072B that are oppositely disposed, and a shortest distance from the first black matrix edge 072A to the first axis of symmetry AS1 is m1, and a shortest distance from the second black matrix side 072B to the first axis of symmetry AS1 is m2; and along the first direction X, the third projection 0820 corresponding to the light extraction opening 082 includes a first light extraction edge 082A and a second light extraction edge 082B that are oppositely disposed, the first light extraction edge 082A and the first black matrix edge 072A are located on a same side of the first axis of symmetry, and the shortest distance from the first light extraction edge 082A to the first axis of symmetry AS is n1, and a shortest distance from the second light extraction side 082B to the first axis of symmetry AS1 is n2; wherein, (m1−m2) (n1−n2)<0. For example, n1>n2, then m1<m2. As shown in FIG. 7, n1>n2, there is a deviation distance of the light extraction opening 082 relative to the pixel opening 031 along a direction opposite to the first direction X, and m1<m2, there is a deviation distance of the black matrix opening 072 relative to the pixel opening 031 along the first direction X. That is to say, since the black matrix opening 072 and the light extraction opening are deviated with respect to the pixel opening 031 in different directions, a risk of deviation of the light extraction opening and the black matrix opening in a same direction can be avoided, which prevent a decrease in yield rate and display quality of the display panel caused by excessive color deviation at a viewing angle in a certain direction. In addition, since the light extraction opening 082 and the black matrix opening 072 are deviated in opposite positions, an influence of fluctuation in an involved process on light-emitting efficiency can be reduced, which mitigates an optical difference of viewing angles in different directions of the display panel, promotes a light-emitting effect of the display panel and guarantees a display effect of the display panel.

Optionally, still referring to FIG. 4, a distance from the second axis of symmetry AS2 to the first axis of symmetry AS1 is a black matrix deviation distance, and a distance from the third axis of symmetry AS3 to the first axis of symmetry AS1 is a light extraction deviation distance, and a ratio of the light extraction deviation distance to the black matrix deviation distance for a same light-emitting unit 04 is a relative deviation distance corresponding to the light-emitting unit. The light-emitting units 04 includes a first light-emitting unit 04A and a second light-emitting unit 04B, and an area of the first light-emitting unit 04A is S1, a relative deviation distance of the first light-emitting unit is K1, an area of the second light-emitting unit is S2, and a relative deviation distance of the second light-emitting unit 04B is K2, wherein (S1−S2)·(K1−K2)>0. The applicant has found through researches that the smaller the area of the light-emitting unit is, the higher the extraction of light by the light extraction layer will be, then attenuation at a corresponding viewing angle will be more obvious and faster. Therefore, in this embodiment, the area of the light-emitting unit is set to be a smaller value, so the relative deviation distances are also smaller. Setting such smaller relative deviation distances ensures a decreased deviation of the light extraction opening relative to the pixel opening, which avoids attenuation fluctuation caused by deviation of the light extraction opening and in turn reduces inconsistency in brightness attenuation and bright difference between various viewing angle.

Optionally, S1>S2, the area of the first light-emitting unit 04A is larger than an area of the second light-emitting unit 04B, the black matrix deviation distance of the first light-emitting unit 04A is equal to the black matrix deviation distance of the second light-emitting unit 04B, and the light extraction deviation distance of the light-emitting unit 04A is larger than the light extraction deviation distance of the second light-emitting unit 04B. In this embodiment, without changing a deviation distance of the black matrix opening, the light extraction deviation distance of a light-emitting unit with a smaller area is set to be smaller, so that attenuation of the light-emitting unit with the smaller area caused by lithe extraction can be reduced, and thereby inconsistency in brightness attenuation and bright difference between various viewing angle can be reduced.

Optionally, S1>S2, the area of the first light-emitting unit 04A is larger than the area of the second light-emitting unit 04B, the light extraction deviation distance of the first light-emitting unit 04A is equal to the light extraction deviation distance of the second light-emitting unit 04B, and the deviation distance of the black matrix of the first light-emitting unit 04A is shorter than the deviation distance of the black matrix of the second light-emitting unit 04B. In this embodiment, the deviation distance of the light extraction opening is maintained as a constant, and the position of the black matrix opening is usable to adjust a different attenuation of the light-emitting unit. The larger the black matrix deviation distance is, the larger a distance from the corresponding black matrix opening to the pixel opening is, and the larger the deviation of the black matrix is, and in turn the stronger the ability of the black matrix to adjust brightness will be, such that brightness attenuation caused by the light extraction layer of the light-emitting unit with a smaller area is compensated by the larger deviation of the black matrix opening.

Optionally, the first light-emitting unit 04A may be a red light-emitting unit, and the second light-emitting unit may be a green light-emitting unit. Alternatively, the first light-emitting unit may be a blue light-emitting unit, and the second light-emitting unit may be a green light-emitting unit.

Figure 8:
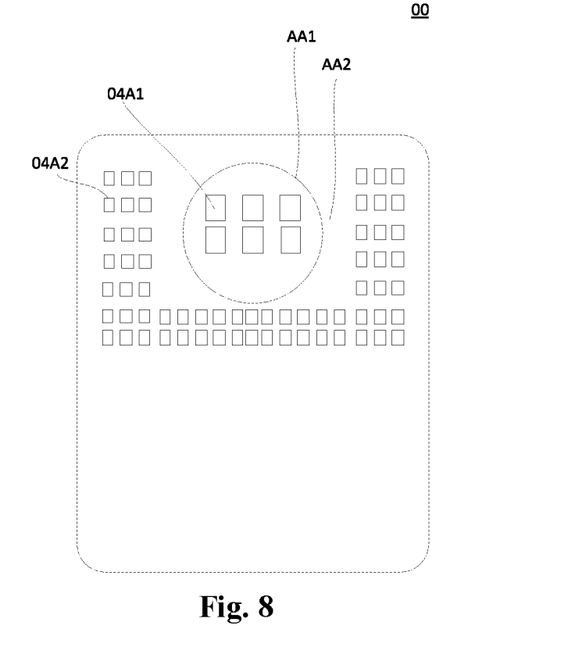
FIG. 8 is a schematic view of another optional implementation of a display panel according to an embodiment of the present application.

FIG. 8 is a schematic view of another optional implementation of a display panel according to an embodiment of the present application. As shown in FIG. 8, the display panel includes a first display area AA1 and a second display area AA2, a light transmitting rate of the first display area AA1 is greater than a light transmitting rate of the second display area AA2. The first light-emitting units 04A includes a first sub-light-emitting unit 04A1 and a second sub-light-emitting unit 04A2 of the same color, an area of the first sub-light-emitting unit 04A1 is S11, and an area of the second sub-light-emitting unit 04A2 is S12, wherein S11>S12, that is to say, the area of the first sub-light-emitting unit 04A1 is larger than the area of the second sub-light-emitting unit 04A2. A relative deviation distance of the first sub-light-emitting unit 04A1 is k11, and a relative deviation distance of the second sub-light-emitting unit 04A2 is k12; wherein k11<k12. In this embodiment, t the light-emitting unit with a smaller area correspondingly has a smaller deviation distance. Such smaller relative deviation distance ensures a reduced deviation of the light extraction opening relative to the pixel opening, and avoids attenuation fluctuation caused by the deviation of the light extraction opening, and thus inconsistence in brightness attenuation and brightness difference of light-emitting units of a same color at various viewing angles can be reduced. The first display area AA1 can be provided with a light sensor such as a camera to achieve functions of taking pictures. It should be noted, in this embodiment, it is described with that the area 04A1 of the first sub-light-emitting unit in the first display area AA1 is larger than the area 04A2 of the second sub-light-emitting unit in the second display area AA2, but the present application is not limited thereto. Optionally, the area of the light-emitting unit in the first display area AA1 may be smaller than the area of the light-emitting units in the second display area AA2.

Figure 9:
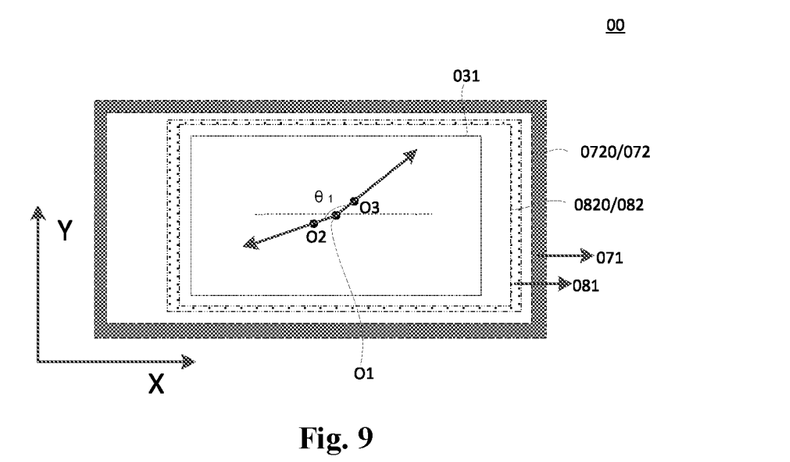
FIG. 9 is a schematic top view of another optional implementation of a display panel according to an embodiment of the present application.

FIG. 9 is a schematic top view of another optional implementation of a display panel according to an embodiment of the present application. As shown in FIG. 9, along a second direction Y, the first center O1 is located between the second center O2 and the third center O3, wherein the second direction Y is perpendicular to the first direction X. It can be understood that, in the second direction Y, the light extraction opening 082 and the black matrix opening 072 are deviated in different directions, so a risk of deviation of the light extraction opening and the black matrix opening in a same direction can be avoided, which prevent a decrease in yield rate and display quality of the display panel caused by excessive color deviation at a viewing angle in a certain direction.

Still referring to FIG. 9, an angle between a direction from the first center O1 to the second center O2 and a direction from the first center O1 to the third center O3 is θ1, wherein 90°<θ1<180°. The angle θ1 between the direction from the first center O1 to the second center O2 and the direction from the first center O1 to the third center O3 is maintained between 90° and 180°, which can ensure that, for each direction, the light extraction opening 082 and the black matrix opening have components in opposite directions. Since the light extraction opening 082 and the black matrix opening 072 are deviated in different directions, a risk of deviation of the light extraction opening and the black matrix opening in a same direction can be avoided, which prevent a decrease in yield rate and display quality of the display panel caused by excessive color deviation at a viewing angle in a certain direction. Optionally, θ1 may be equal to 180°, and at this time, the light extraction opening 082 and the black matrix opening 072 are deviated to different directions along one certain direction.

Optionally, the light-emitting unit includes a light-emitting unit of a first color, which includes a first sub-unit and a second sub-unit, a direction from a first center of the pixel opening corresponding to the first sub-unit to a third center of the light extraction opening corresponding to the first sub-unit is a third direction, and a direction from the second center of the pixel opening corresponding to the second sub-unit to the third center of the light extraction opening corresponding to the second sub-unit is a fourth direction; wherein an angle between the third direction and the fourth direction is θ2, wherein 90°<θ2≤180°.

Figure 10:
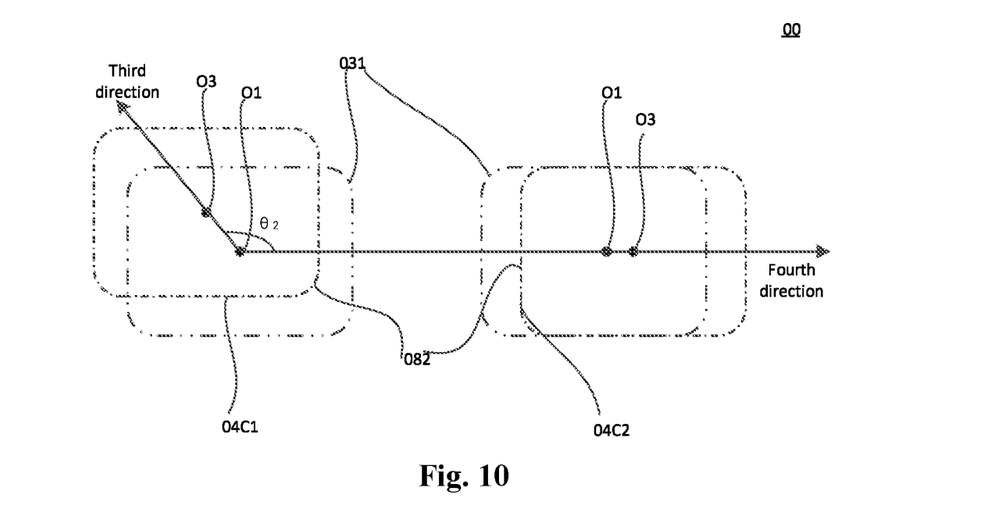
FIG. 10 is a schematic top view of another optional implementation of a display panel according to an embodiment of the present application.

FIG. 10 is a schematic top view of another optional implementation of a display panel according to an embodiment of the present application. As shown in FIG. 10, the light-emitting units 04 includes a light-emitting unit 04C of a first color, which includes a first sub-unit 04C1 and a second sub-unit 04C2, a direction from the first center O1 of the pixel opening 031 corresponding to the first sub-unit 04C1 to the third center O3 of the light extraction opening 082 corresponding to the first sub-unit 04C1 is a third direction, and a direction from the second center O2 of the pixel opening 031 corresponding to the second sub-unit 04C2 to the third center O3 of the light extraction opening 082 corresponding to the second sub-unit 04C2 is a fourth direction; wherein an angle between the third direction and the fourth direction is θ2, wherein 90°<θ2≤180°. The light extraction openings corresponding to light-emitting units of the same color has different deviation directions relative to the pixel opening, which ensures that the light extraction openings have opposite deviation components in respective directions to prevent a decrease in yield rate and display quality of the display panel caused by excessive color deviation at a viewing angle in a certain direction and reduce an influence of fluctuation in the involved process on the light-emitting efficiency, so that an optical difference of viewing angles in different directions of the display panel can be mitigated Optionally, θ2=180° which means that the light extraction opening 082 corresponding to the first sub-unit 04C1 and the light extraction opening 082 corresponding to the second sub-unit 04C2 are deviated to opposite directions.

Optionally, in the first sub-unit, a distance from the first center to the third center is D1; in the second sub-unit, a distance from the first center to the third center is D2, wherein D1=D2. Compared to the previous embodiment, the deviation of the light extraction opening relative to the pixel opening is controlled within a preset range and it is set that D1=D2 in this embodiment, which can reduce an influence of fluctuation the involved process on the light-emitting efficiency. Optionally, it may be that D1=D2=0.5 μm.

Figure 11:
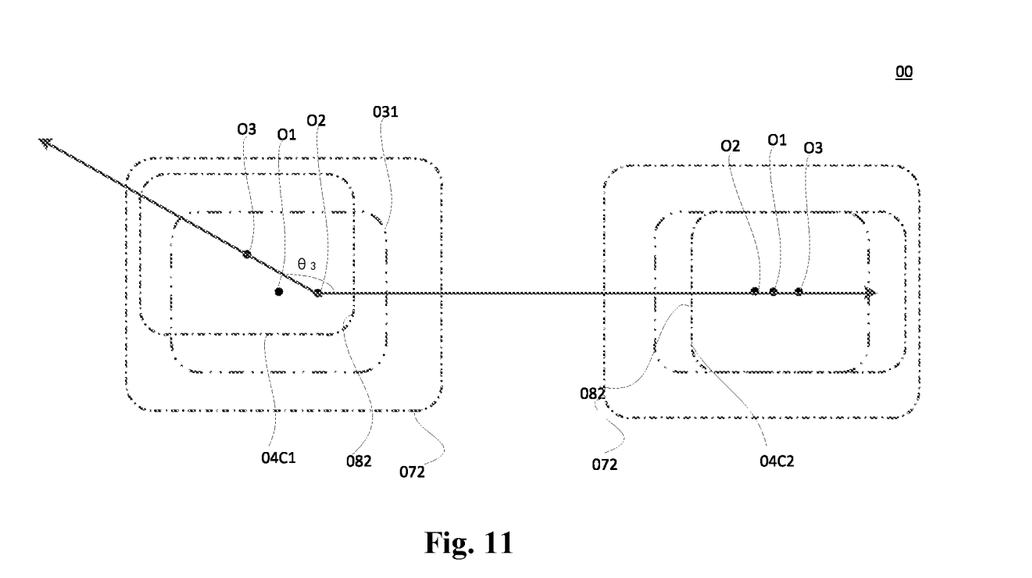
FIG. 11 is a schematic top view of another optional implementation of a display panel according to an embodiment of the present application.

Optionally, an angle between the direction from the second center to the third center in the first sub-unit and the direction from the second center to the third center in the second sub-unit is θ3; wherein 90°<θ3≤180°. FIG. 11 is a schematic top view of another optional implementation of a display panel according to an embodiment of the present application. As shown in FIG. 11, an angle between the direction from the second center O2 to the third center O3 in the first sub-unit 04C1 and the direction from the second center O2 to the third center O3 in the second sub-unit 04C2 is θ3, wherein 90°<θ3≤180°. The light extraction openings corresponding to light-emitting units of the same color has different deviation directions relative to the pixel opening, which ensures that the light extraction openings have opposite deviation components in respective directions to prevent a decrease in yield rate and display quality of the display panel caused by excessive color deviation at a viewing angle in a certain direction and reduce an influence of fluctuation in the involved process on the light-emitting efficiency, so that an optical difference of viewing angles in different directions of the display panel can be mitigated. Optionally, it may be that θ3=180°, which means that the black matrix opening 072 corresponding to the first sub-unit 04C1 and the black matrix opening 072 corresponding to the second sub-unit 04C2 are deviated to opposite directions.

Figure 12:
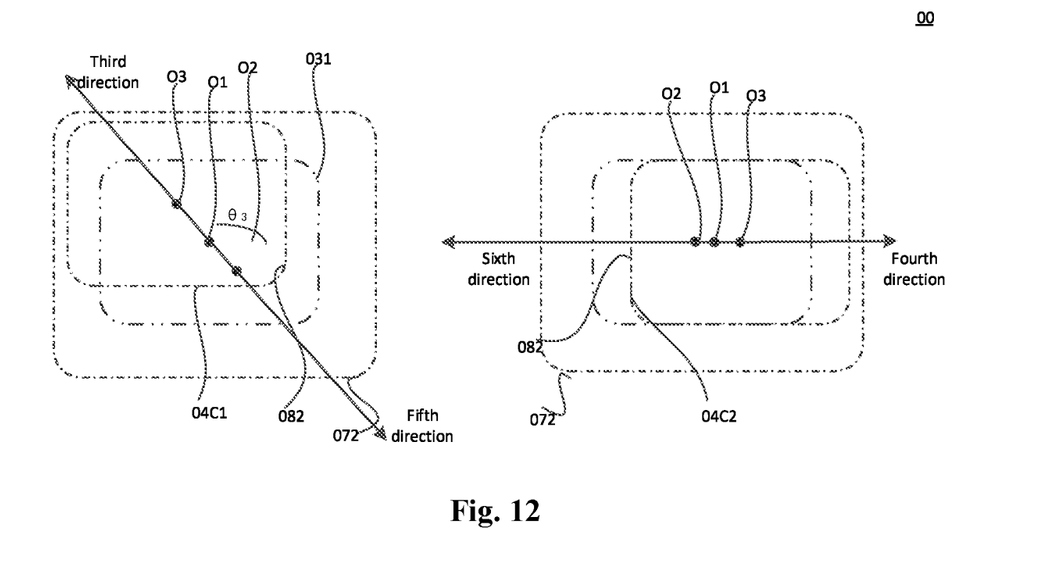
FIG. 12 is a schematic top view of another optional implementation of a display panel according to an embodiment of the present application.

FIG. 12 is a schematic top view of another optional implementation of a display panel according to an embodiment of the present application. As shown in FIG. 112, optionally, a direction from the first center O1 of the pixel opening 031 corresponding to the first sub-unit 04C1 to the second center O2 of the black matrix opening 072 corresponding to the first sub-unit 04C1 is a fifth direction, and a direction from the first center O1 of the pixel opening 031 corresponding to the second sub-unit 04C2 to the second center O2 of the black matrix opening 072 corresponding to the second sub-unit 04C2 is a sixth direction; wherein the fifth direction is opposite to the third direction, and the sixth direction is opposite to the fourth direction. In this embodiment, for different light-emitting units of the same color, the light extraction opening 082 and the black matrix opening 072 are deviate along different directions, which avoids a risk of deviation of the light extraction openings and the black matrix openings in a same direction and prevent a decrease in yield rate and display quality of the display panel caused by excessive color deviation at a viewing angle in a certain direction.

Optionally, in the first sub-unit, a distance from the first center to the second center is D3; in the second sub-unit, a distance from the first center to the second center is D4, wherein D3=D4. In this embodiment, the deviation of the light extraction opening relative to the pixel opening is controlled within a preset range and it is set that D3=D4, which can reduce an influence of fluctuation the involved process on the light-emitting efficiency. Optionally, it may be that D4=D3=0.5 μm.

Optionally, along the first direction, a group of first units and a group of second units are alternately disposed, the group of first units includes N1 first sub-units, and the group of second unit includes N2 second sub-units, wherein N1≥1, N2≥1. That is to say, along the first direction, the light-emitting units with different deviations of the light extraction opening and black matrix opening are arranged alternately. Compared with a solution for improving only one single viewing angle, this embodiment can further reduce color difference between various viewing angles of the entire display panel, which ensure color deviation in some areas of the display panel at a certain viewing angle will not be serious. Optionally, it may be that N1=N2.

Optionally, along the second direction, a group of third units and a group of fourth units are alternately disposed, the group of third units includes n1 third sub-units, and the group of fourth units includes n2 fourth sub-units, wherein n1≥1, n2≥1, and n1≠N1, n2≠N2. That is to say, along the second direction, the light-emitting units with different deviations of the light extraction opening and black matrix opening are arranged alternately. Compared with a solution for improving only one single viewing angle, this embodiment can further reduce color difference between various viewing angles of the entire display panel, which ensure color deviation in some areas of the display panel at a certain viewing angle will not be serious. In addition, the alternate disposition both in the first direction and in the second direction ensures that there is a deviation to compensate for color deviation in each direction so as to ensure the display. Optionally, it may be that n1=n2.

Optionally, the light-emitting unit of the first color is a green light-emitting unit. Generally, an area of a green light-emitting unit is smaller than an area of a red light-emitting unit and a blue light-emitting unit, and a green light-emitting unit with a smaller area has relatively more serious attenuation at certain viewing angle. Optionally, only a green light-emitting unit in the display panel is set according to the present application.

Figure 13:
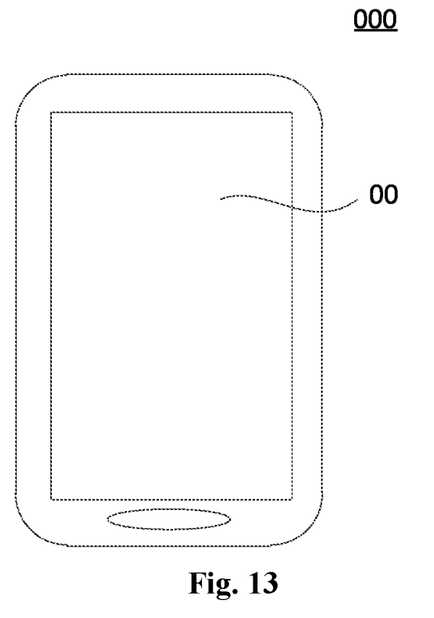
FIG. 13 is a schematic view of a display device according to an embodiment of the present application.

The present application further provides a display device. FIG. 13 is a schematic view of the display device according to an embodiment of the present application. The display device 000 includes the display panel 00 according to any embodiment of the present application. The display device according to the present application include but is not limited to: a television, a notebook computer, a desktop monitor, a tablet computer, a digital camera, a mobile phone, a smart bracelet, smart glasses, a vehicle-mounted monitor, medical equipment, industrial control equipment, a touch interaction terminal etc.

It can be seen from the embodiments above that the display panel and the display device according to the present application at least achieve following beneficial effects:

in the light extraction layer and the light filtering layer, the second center of the light extraction opening and the third center of the black matrix opening are not aligned with each other, that is the light extraction opening and the black matrix opening have different deviation positions, which can not only ensure light-emitting efficiency of the display panel through the light extraction layer, but also the; enable adjustment of brightness at a viewing angle by using positions of color resist units of the light filtering layer and deviation positions of the black matrix openings due to non-complete overlapping of the black matrix opening and the light extraction opening, so as to improve azimuthal chromatic aberration caused by light extraction structures. In addition, since the light extraction opening and the black matrix opening are deviated in opposite positions, an influence of fluctuation in an involved process on light-emitting efficiency can be reduced, which migrates an optical difference of viewing angles in different directions of the display panel, promotes a light-emitting effect of the display panel and guarantees a display effect of the display panel.

The content above are further detailed descriptions of the present application in combination with specific preferred implementations, and it cannot be considered that specific implementation of the present application is limited to these descriptions. For those skilled in the art of the present application, without departing from concept of the present application, some simple deductions or substitutions can be made, which should be within protection scope of the present application.

What is claimed is:

1. A display panel, comprising:
a substrate;
a pixel definition layer and light-emitting units, wherein the pixel definition layer is located on a side of the substrate and comprises multiple pixel openings which define the light-emitting units; and
a light filtering layer and a light extraction layer located on a side of a light-emitting layer including the light-emitting units away from the substrate, wherein the light filtering layer comprises black matrixes including black matrix openings, which are disposed corresponding to the light-emitting units, and the light extraction layer comprises a first matching layer and a second matching layer, the first matching layer is located on a side of the second matching layer close to the substrate and comprises light extraction openings, which are disposed corresponding to the light-emitting units;

wherein an orthographic projection of the pixel opening on the substrate is a first projection, a geometric center of the first projection is a first center; an orthographic projection of the black matrix opening on the substrate is a second projection, a geometric center of the second projection is a second center; an orthographic projection of the light extraction opening on the substrate is a third projection, and a geometric center of the third projection is a third center; and wherein the second center and the third center are not aligned with each other, the first projection and the third projection at least partially overlap.

2. The display panel of claim 1, wherein the light filtering layer is located on a side of the light extraction layer close to the substrate, and along a first direction, a width of the black matrix opening is wider than a width of the light extraction layer opening, wherein the first direction is a direction from a light-emitting unit to another light-emitting unit.

3. The display panel of claim 2, wherein the second projection covers the third projection, and an area of the second projection is larger than an area of the third projection, and along the first direction, the first center is located between the second center and the third center.

4. The display panel of claim 3, wherein the first projection has a first axis of symmetry passing through the first center, the second projection has a second axis of symmetry passing through the second center, and the third projection has a third axis of symmetry passing through the third center, and along the first direction, the first axis of symmetry is located between the second axis of symmetry and the third axis of symmetry.

5. The display panel of claim 4, wherein:

along the first direction, the second projection corresponding to the black matrix opening comprises a first black matrix side and a second black matrix side disposed oppositely, a shortest distance from the first black matrix side to the first axis of symmetry is m1, and a shortest distance from the second black matrix side to the first axis of symmetry is m2; and along the first direction, the third projection corresponding to the light extraction opening comprises a first light extraction side and a second light extraction side disposed oppositely, the first light extraction side and the first black matrix side are located on a same side of the first axis of symmetry, a shortest distance from the first light extraction side to the first axis of symmetry is n1, and a shortest distance from the second light extraction side to the first axis of symmetry axis is n2, wherein $(m1-m2)\cdot(n1-n2)<0$.

6. The display panel of claim 5, wherein a distance from the second axis of symmetry to the first axis of symmetry is a black matrix deviation distance, a distance from the third axis of symmetry to the first axis of symmetry is a light extraction deviation distance, and a ratio of the light extraction deviation distance to the black matrix deviation distance for a same light-emitting unit is a relative deviation distance of the light-emitting unit; and the light-emitting units comprises a first light-emitting unit and a second light-emitting unit, an area of the first light-emitting unit is S1, the relative deviation distance of the first light-emitting unit is K1, an area of the second light-emitting unit is S2, and the relative deviation distance of the second light-emitting unit is K2, wherein $(S1-S2)\cdot(K1-K2)>0$.

7. The display panel of claim 6, wherein S1>S2, and the black matrix deviation distance of the first light-emitting unit is equal to the black matrix deviation distance of the second light-emitting unit, and the light extraction deviation distance of the light-emitting unit is longer than the light extraction deviation distance of the second light-emitting unit.

8. The display panel of claim 6, wherein S1>S2, and the light extraction deviation distance of the light-emitting unit is equal to the light extraction deviation distance of the second light-emitting unit, and the black matrix deviation distance of the first light-emitting unit is shorter than the black matrix deviation distance of the second light-emitting unit.

9. The display panel of claim 6, wherein the first light-emitting unit comprises a first sub-light-emitting unit and a second sub-light-emitting unit of a same color, an area of the first sub-light-emitting unit is S11, and an area of the second sub-light-emitting unit is S12, wherein S11>S12, and the relative deviation distance of the first sub-light-emitting unit is k11, and the relative deviation distance of the second sub-light-emitting unit is k12, wherein k11<k12.

10. The display panel of claim 3, wherein along a second direction, the first center is located between the second center and the third center, wherein the second direction is perpendicular to the first direction.

11. The display panel of claim 10, wherein an angle between a direction from the first center to the second center and a direction from the first center to the third center is θ1, wherein 90°<θ1≤180°.

12. The display panel of claim 1, wherein the light-emitting units comprises a light-emitting unit of a first color including a first sub-unit and a second sub-unit, a direction from a first center of the pixel opening corresponding to the first sub-unit to a third center of the light extraction opening corresponding the first sub-unit is a third direction, and a direction from a first center of the pixel opening corresponding to the second sub-unit to a third center of the light extraction opening corresponding the second sub-unit is a fourth direction; and wherein an angle between the third direction and the fourth direction is θ2, 90°<θ2≤180°.

13. The display panel of claim 12, wherein a distance from the first center to the third center corresponding to the first sub-unit is D1, and a distance from the first center to the third center corresponding to the second sub-unit is D2, wherein D1=D2.

14. The display panel of claim 12, wherein an angle between a direction from the second center to the third center corresponding to the first sub-unit and a direction from the second center to the third center of the second sub-unit is θ3, wherein 90°<θ3≤180°.

15. The display panel of claim 12, wherein a direction from the first center of the pixel opening corresponding to the first sub-unit to the second center of the black matrix opening corresponding to the first sub-unit is a fifth direction, and a direction from the first center of the pixel opening corresponding to the second sub-unit to the second center of the black matrix opening corresponding to the second sub-unit is a sixth direction, and wherein the fifth direction is opposite to the third direction, and the sixth direction is opposite to the fourth direction.

16. The display panel of claim 15, wherein a distance from the first center to the second center corresponding to the first sub-unit, is D3, and a distance from the first center to the second center of the second sub-unit is D4, wherein D3=D4.

17. The display panel of claim 16, wherein along a first direction from a light-emitting unit to another light-emitting unit, a group of first units and a group of second units are alternately disposed, the group of first units comprises N1 first subunits, and the group of second units comprises N2 second subunits, wherein N1≥1, N2≥1;
   wherein along a second direction perpendicular to the first direction, a group of third units and a group of fourth units are alternately disposed, the group of third units comprises n1 third sub-units, and the group of fourth unit comprises n2 fourth sub-units, wherein n1≥1, n2≥1, and n1≠N1, n2≠N2.

18. The display panel of claim 1, wherein the light filtering layer is located on a side of the light extraction layer away from the substrate, and along a first direction, a width of the black matrix opening is wider than a width of the light extraction opening, wherein the first direction is a direction from a light-emitting unit to another light-emitting unit.

19. A display device, comprising a display panel, wherein the display panel comprises:
   a substrate;
   a pixel definition layer and light-emitting units, wherein the pixel definition layer is located on a side of the substrate and comprises multiple pixel openings which define the light-emitting units; and
   a light filtering layer and a light extraction layer located on a side of a light-emitting layer including the light-emitting units away from the substrate, wherein the light filtering layer comprises black matrixes including black matrix openings, which are disposed corresponding to the light-emitting units, and the light extraction layer comprises a first matching layer and a second matching layer, the first matching layer is located on a side of the second matching layer close to the substrate and comprises light extraction openings, which are disposed corresponding to the light-emitting units;
   wherein an orthographic projection of the pixel opening on the substrate is a first projection, a geometric center of the first projection is a first center; an orthographic projection of the black matrix opening on the substrate is a second projection, a geometric center of the second projection is a second center; an orthographic projection of the light extraction opening on the substrate is a third projection, and a geometric center of the third projection is a third center; and
   wherein the second center and the third center are not aligned with each other, the first projection and the third projection at least partially overlap.

20. A display panel, comprising:
   a substrate;
   a pixel definition layer and light-emitting units, wherein the pixel definition layer is located on a side of the substrate and comprises multiple pixel openings which define the light-emitting units; and
   a light filtering layer and a light extraction layer located on a side of a light-emitting layer including the light-emitting units away from the substrate, wherein the light filtering layer comprises black matrixes including black matrix openings, which are disposed corresponding to the light-emitting units, and the light extraction layer comprises a first matching layer and a second matching layer, the first matching layer is located on a side of the second matching layer close to the substrate and comprises light extraction openings, which are disposed corresponding to the light-emitting units;
   wherein an orthographic projection of the pixel opening on the substrate is a first projection, a geometric center of the first projection is a first center; an orthographic projection of the black matrix opening on the substrate is a second projection, a geometric center of the second projection is a second center; an orthographic projection of the light extraction opening on the substrate is a third projection, and a geometric center of the third projection is a third center; and
   wherein the second center and the third center are not aligned with each other;
   wherein the light filtering layer is located on a side of the light extraction layer close to the substrate, and along a first direction, a width of the black matrix opening is wider than a width of the light extraction layer opening, wherein the first direction is a direction from a light-emitting unit to another light-emitting unit;
   wherein the second projection covers the third projection, and an area of the second projection is larger than an area of the third projection, and along the first direction, the first center is located between the second center and the third center.

* * * * *